(12) United States Patent
Mumbauer et al.

(10) Patent No.: US 7,431,853 B2
(45) Date of Patent: Oct. 7, 2008

(54) SELECTIVE ETCHING OF OXIDES FROM SUBSTRATES

(75) Inventors: Paul D. Mumbauer, Mohrsville, PA (US); Paul Roman, Whitehall, PA (US); Robert Grant, Camden, ME (US)

(73) Assignee: Primaxx, Inc., Allentown, PA (US)

( * ) Notice: Subject to any disclaimer, the term of this patent is extended or adjusted under 35 U.S.C. 154(b) by 315 days.

(21) Appl. No.: 11/370,541

(22) Filed: Mar. 8, 2006

(65) Prior Publication Data

US 2006/0207968 A1    Sep. 21, 2006

Related U.S. Application Data

(60) Provisional application No. 60/659,665, filed on Mar. 8, 2005.

(51) Int. Cl.
*C23F 1/00* (2006.01)
(52) U.S. Cl. .............. 216/2; 216/58; 216/73; 216/79; 134/3; 134/31; 438/706; 438/739; 438/745; 438/756
(58) Field of Classification Search .............. 216/2; 134/3; 438/706
See application file for complete search history.

(56) References Cited

U.S. PATENT DOCUMENTS 6,666,979 B2 * 12/2003 Chinn et al. .............. 216/2
6,916,728 B2 *  7/2005 Gogoi et al. .............. 438/481

* cited by examiner

*Primary Examiner*—Binh X Tran
*Assistant Examiner*—Maki Angadi
(74) *Attorney, Agent, or Firm*—Michael B. Fein; Cozen O'Connor

(57) ABSTRACT

A method and system for release etching a micro-electrical-mechanical-systems (MEMS) device from a substrate. In one aspect, the invention is a method comprising (a) supporting at least one substrate having a sacrificial oxide and a non-sacrificial material in a process chamber at a pressure and at a temperature; (b) introducing a gas phase mixture comprising a halide-containing species and an alcohol vapor selected from a group consisting of ethanol, 1-propanol, and an aliphatic alcohol having four carbon groups into the process chamber, the gas phase mixture having a volumetric ratio of the halide-containing species to the alcohol vapor of approximately 2 or less; and (c) etching the sacrificial oxide with the gas phase mixture. In another aspect, the invention is a system for carrying out the method.

21 Claims, 6 Drawing Sheets

SELECTIVE ETCHING OF OXIDES FROM SUBSTRATES

CROSS-REFERENCE TO RELATED APPLICATION

Benefit of Provisional Application 60/659,665, filed Mar. 8, 2005, is claimed and is hereby incorporated by reference.

FIELD OF THE INVENTION

The present invention relates generally to the field of etching oxides from substrates, and specifically to methods of selectively etching oxides from substrates to release microelectromechanical systems ("MEMS") devices while minimizing stiction. The present invention, however, can also be used to etch oxides from substrates used during the manufacture of integrated circuits.

BACKGROUND OF THE INVENTION

MEMS device manufacturing includes the construction of physical elements that are added to the traditional solid-state circuitry on chips known as integrated circuits ("ICs"). These physical elements can add significantly to the functional capability of the integrated circuit. For example, MEMS devices such as accelerometers, gyroscopes, gas density sensors, chemical or enzyme sensors, optical projection or redirection devices, micro-pumps, and pressure sensors have been fabricated. Usually, the physical motion or reaction of the MEMS device to external forces are measured through changes in capacitance, inductance, intrinsic resistance, etc. However, some MEMS devices cause physical action rather than measure physical forces such. Examples of such physical action include micro-pumping or mirror angle change.

The technology used to construct/manufacture MEMS devices has steadily evolved since its inception. At first, MEMS physical elements were constructed using such etching processes such as Reactive Ion Etching ("RIE") and chemical bath etching because these processes were already available to IC fabs. One type of chemical bath etching used in early MEMS device construction was a hydrofluoric acid ("HF") bath. The MEMS devices/features that could be successfully produced with these methods and equipment tended to be purely vertical in nature. When the MEMS features became largely horizontal and undercut, the features had to be large enough so that liquid bath processing could be used, and liquid withdrawn at the end of the process however, as MEMS undercut features became smaller and smaller, withdrawing or drying out the small capillaries or undercut features became more challenging. Liquid to wall adhesion or surface tension tended to cause collapse of the thin overhanging MEMS features. This problem is referred to as "stiction."

In addition to stiction, HF bath etching faced additional disadvantages, namely an inability to achieve high etch selectivity of materials (e.g., the etching of oxide1 vs. oxide2). Other challenges included HF etching selectivity to metals that can be used to make contacts to the MEMS elements such as Aluminum, Copper, Gold, Silver, Titanium Nitride and other conductive materials.

In the early 1990s, an HF and alcohol etching process was developed as an alternative to the traditional HF water etch process to help eliminate some of the disadvantages in MEMS construction. The HF and alcohol etch process helped solve some of the purely chemical issues but did not help with the "stiction" problem, especially as features started to shrink toward the 10 or even 1 micron scale. While it is true that solid state circuit elements were being made in the micron scale at that time, the fact that MEMS are physical elements introduced additional processing hurdles that prohibited the construction on micron scale. Thu, a better process was needed that could etch small pathways without creating "stiction" and without attacking adjacent materials.

In the middle 1990s, a process called Super-Critical-Carbon Dioxide ("$CO_2$") drying was developed. This process, which operates at about 2000 pounds per square inch ("PSI") and at about 30 degrees Celsius (° C.) using $CO_2$ gas, is able to remove liquids in small capillaries. While this process was marginally successful, it was also cumbersome because it required a separate piece of equipment that allowed the MEMS chips to partially dry during transport to the super-critical CO2 equipment. This partial drying during transport caused stiction.

A gas phase, atmospheric pressure, process was also developed at this time using HF and alcohol to eliminate some of the problems with wet etching. While this gas phase HF/alcohol etching process was able to etch in small places, it often left liquid residues based on the byproducts of the etch since the byproduct vapor pressure was lower than the processing pressure.

Primaxx, Inc. then developed a reduced pressure HF/alcohol etch process to overcome the deficiencies of the atmospheric HF/alcohol process. This process is described in U.S. Pat. No. 5,439,553, Grant et al., the teachings of which are hereby incorporated by reference in its entirety. The reduced pressure HF/alcohol etch process depends heavily on the vapor pressures and partial pressures of the constituent gases. Several advantages were realized by the reduced pressure HF/alcohol etch process, including the elimination of "stiction" and the minimization of attack on companion materials such as metals and nitrides. The reduced pressure HF/alcohol process was developed in a single wafer reactor, and was integrated into a cluster tool using, for example a Brooks Automation robotic handler. However, in order to control "stiction" and etch selectivity, the application of the reduced pressure HF/alcohol etch process proved to be a fairly lengthy process, often taking 20-30 minutes (or longer) to complete release etching of the MEMS device. In order to become viable in production it was thought that the process needed to be reduced.

The problem in implementation however came in the form of wafer-to-wafer uniformity. The etch uniformity throughout the wafer needed to stay well ahead of the 10% uniformity limit. This proved to be difficult due to the construction requirements of a cluster tool. The wafer loading and unloading requirements placed a burden on fluid dynamics and other process control design criteria.

In order to solve the throughput problem, it was thought that a multiple wafer reactor could be constructed, but in practice, the top and bottom wafers in a stack of wafers often etched differently than the rest of the batch. Also, the "slit valve" feature where wafers were loaded created a slight swirl or disturbance to the gas flow in the reactor. The temperature control of a stainless steel or nickel reactor (required due to material compatibility with HF gas) was found to be an important factor. Variations in temperature were found to result in variations in etch uniformly across the wafers. These structural problems were addressed in Primaxx's recent design of a batch processing chamber for MEMS construction, which is the subject of a co-pending U.S. patent application Ser. No. 10/991,554, filed Nov. 18, 2004. However, deficiencies in the available etching process, including the reduced pressure HF/alcohol etch, still presented substantial obstacles with respect to yield.

As discussed above, reduced pressure gas phase HF/alcohol etching has proven to be very useful in the production of MEMS devices but has some drawbacks. Some of the earliest reports of HF/alcohol reduced pressure SiO$_2$ etching are *Reduced Pressure Etching of Thermal Oxides in Anhydrous HF/Alcoholic Gas Mixtures*, by Kevin Torek and Jersey Ruzyllo; Modeling and Characterization of Gas-Phase Etching of Thermal Oxide and TEOS Oxide Using Anhydrous HF and Ch3OH, by Chun Su Lee et al; and *Fabrication of MEMS devices by using anhydrous HF gas-phase etching with alcoholic vapor*, by Won Ick Jang, Chang Auck Choi et al. In these papers and related patent work, specific alcohols were determined to provide good results using various criterion. In the Torek paper, methanol was selected over ethanol or isopropanol due to its superior residue performance while etching oxides of silicon prior to gate oxidation and other critical applications. In the Choi work, the amounts of reactants (HF and methanol) on the surface were shown to be proportional to the partial pressures and had an influence on oxide to oxide type selectivity. In the Jang work, methanol and isopropanol were cited as excellent catalysts for MEMS silicon oxide release etching due to superior etch control with no "stiction" of the MEMS released beams.

SUMMARY OF THE INVENTION

The present invention sets forth new criteria for etch evaluation in the release of MEMS devices and other microstructures. The present invention introduces for the first time a special characteristic of ethanol, 1-propanol, and aliphatic alcohols having four carbon groups which uniquely provide a condition for overall improved etch selectivity and/or etch uniformity while maintaining sufficient etch rates. Examples of suitable aliphatic alcohols having four carbon groups include, without limitation, 1-butanol and 2-butanol.

In one aspect, the invention is a method of releasing a MEMS device from a substrate comprising: (a) supporting at least one substrate having a sacrificial oxide and a non-sacrificial material in a process chamber at a pressure and at a temperature; (b) introducing a gas phase mixture comprising a halide-containing species and an alcohol vapor selected from a group consisting of ethanol, 1-propanol, and an aliphatic alcohol having four carbon groups into the process chamber, the gas phase mixture having a volumetric ratio of the halide-containing species to the alcohol vapor of approximately 2 or less; and (c) etching the sacrificial oxide with the gas phase mixture.

In another aspect, the invention is a system for releasing a micro-electrical-mechanical-systems (MEMS) device from a substrate comprising: a process chamber having a support for supporting at least one substrate having a sacrificial oxide and a non-sacrificial material; a source of an alcohol selected from a group consisting of ethanol, 1-propanol, and an aliphatic alcohol having four carbon groups fluidly coupled to the process chamber; source of a halide-containing species fluidly coupled to the process chamber; and means for simultaneously supplying the alcohol as a vapor and the halide-containing species as a gas to the process chamber such that a volumetric ratio of the halide-containing species gas to the alcohol vapor is approximately 2 or less.

DETAILED DESCRIPTION OF THE DRAWINGS

The present invention sets forth new criteria for etch evaluation in the release of MEMS devices and other microstructures from a silicon substrate. New criteria have been discovered that affect etching parameters such as selectivity and/or uniformity, particularly at or near the etch sites of deep features on the substrate surface. Basic fabrication steps for fabricating and releasing a MEMS device are discussed below with the understanding that the present invention can be used to perform the etching in any MEMS device fabrication process.

Figure 1:
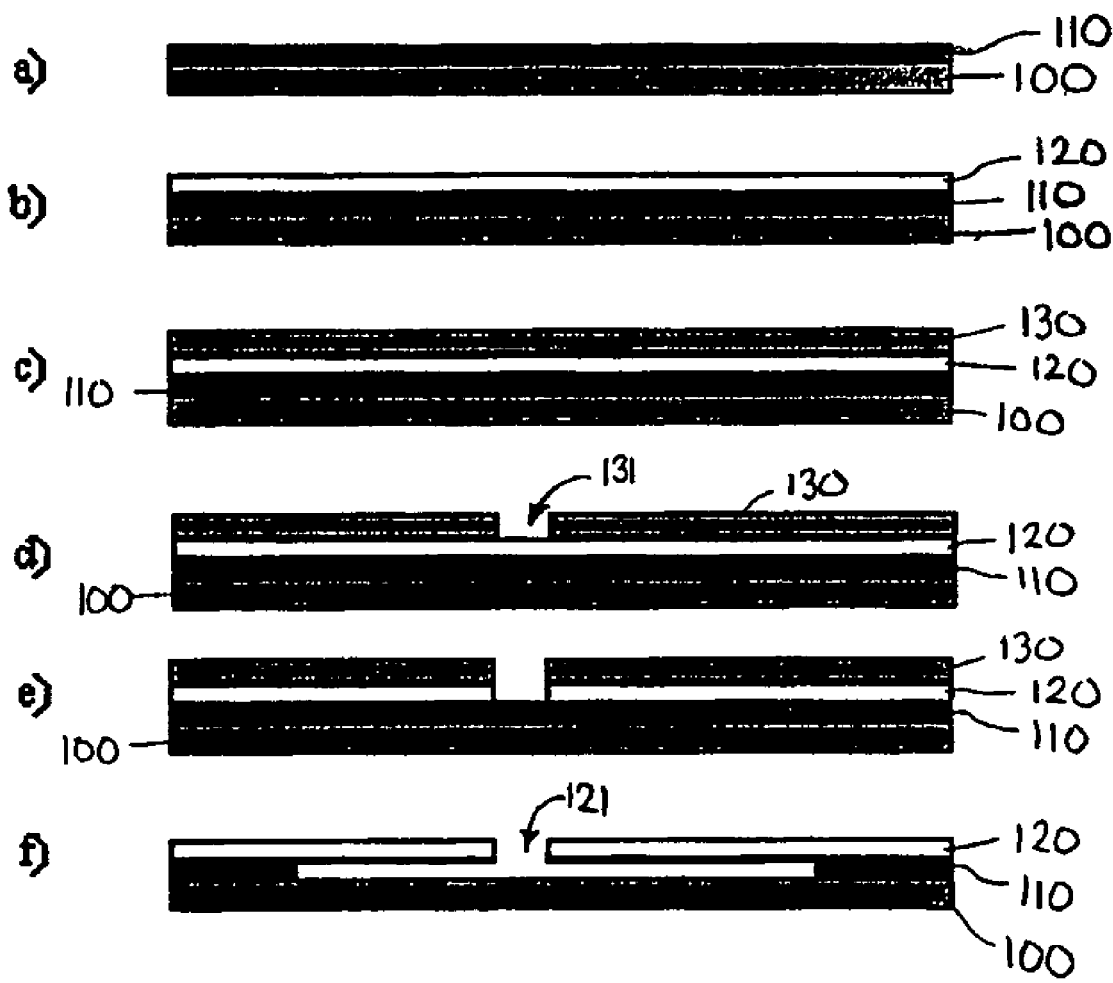
FIG. 1 is a schematic illustrating the fabrication steps in creating a MEMS device from a silicon substrate according to an embodiment of the present invention.

FIG. 1 schematically illustrates one etching process in forming/releasing a MEMS device from a silicon substrate. In step a), a sacrificial layer 110 of silicon oxide ("SiO2") is deposited on a silicon substrate 100 using CVD or thermal oxide methods. In step b), doped or undoped a structural layer 120 of polysilicon is deposited with a CVD method. In step c), a layer 130 of positive photoresist is deposited with a spin-on method. The layer 130 of photoresist is exposed with a mask (not illustrated) and then patterned by a developing solution. The pattern in the layer 130 of photoresist will comprise various openings 131 that expose areas of the layer 120 of polysilicon, as shown in step d). In step e), a plasma RIE etch patterns the layer 120 of polysilicon in a manner that corresponds to the patterned layer 130 of photoresist, thereby exposing areas of the layer 110 of the sacrificial SiO2. An oxygen plasma then strips the remaining portions of the layer 130 of photoresist from the layer 120 of polysilicon.

In step f), a release etch is performed by contacting the entire substrate with a gaseous mixture of HF gas and an alcohol vapor, preferably in a sub-atmospheric pressure environment. The gaseous mixture of HF and alcohol vapor etches the layer 110 of sacrificial SiO2 through the patterned opening 121 in the layer of polysilicon 120. The etching continues until a desired amount of the layer 110 of the sacrificial SiO2 is etched. In many MEMS devices, it is desirable to etch the layer 110 of sacrificial SiO2 until the layer 110 of sacrificial SiO2 sufficiently undercuts the layer 120 of polysilicon, thereby forming a desired undercut MEMS device.

Figure 2:
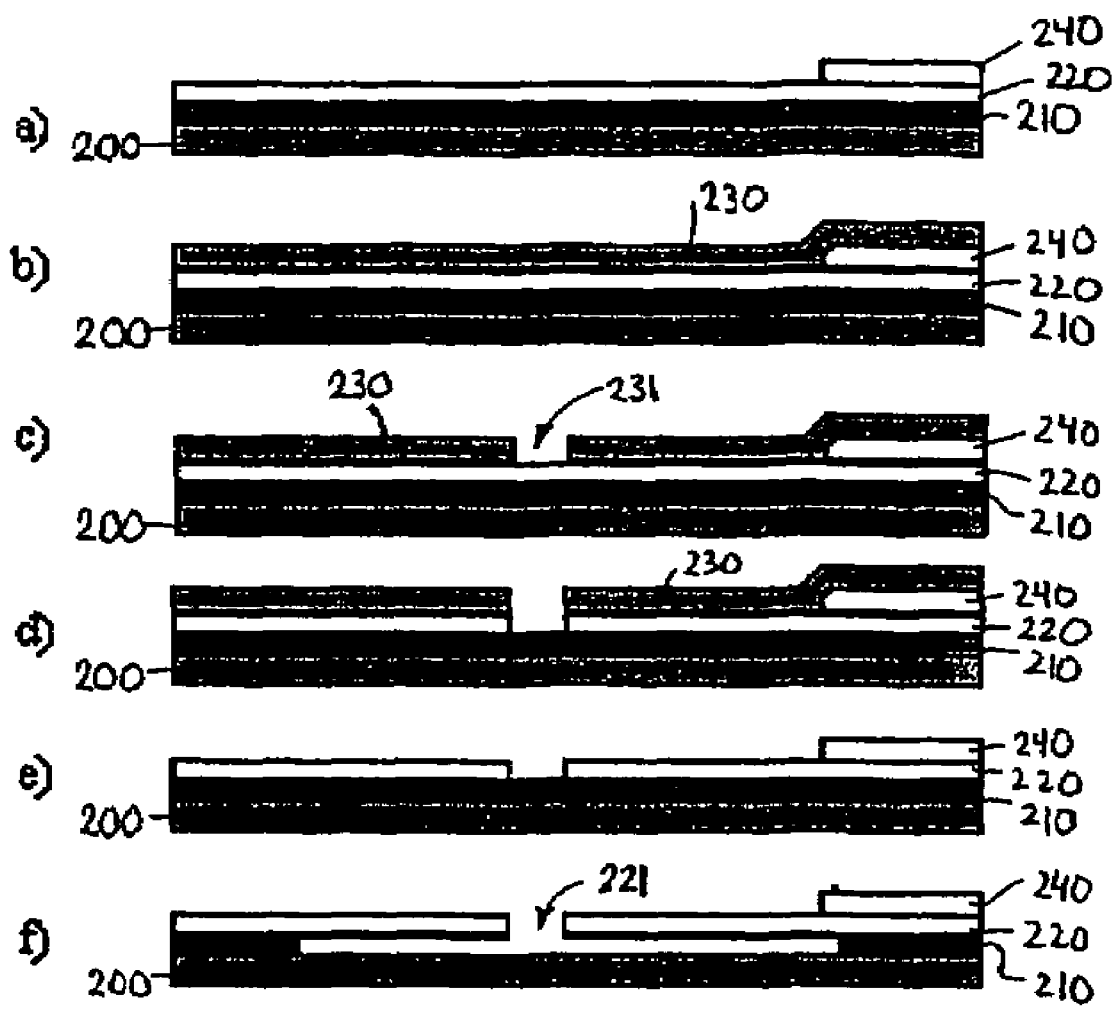
FIG. 2 is a schematic illustrating the fabrication steps in creating a MEMS device from a silicon substrate utilizing an additional exposed layer of silicon nitride material according to an embodiment of the present invention.

Referring now to FIG. 2, a schematic representation of a MEMS device fabrication process is illustrated where an additional layer 240 of exposed silicon nitride material is applied. In the MEMS device fabrication process of FIG. 2, sequence steps a) through f) are identical to steps a) through f) of the process of FIG. 1 except that an extra layer 240 of silicon nitride is added atop the layer 220 of polysilicon.

The layer 240 of silicon nitride is added to portions of the layer 220 of polysilicon at step a), which is prior to the photoresist being applied and patterned according to steps b) and c). At step d), the pattern in the layer 230 of photoresist will comprise various openings 231 that expose areas of the layer 220 of polysilicon. In step e), a plasma RIE etch patterns the layer 220 of polysilicon in a manner that corresponds to the patterned layer 230 of photoresist, thereby exposing areas of the layer 210 of the sacrificial SiO2. An oxygen plasma then strips the remaining portions of the layer 230 of photoresist from the layer 220 of polysilicon.

In step f), a release etch is performed by contacting the entire substrate with a gaseous mixture of HF gas and an alcohol vapor, preferably in a sub-atmospheric pressure environment. The gaseous mixture of HF and alcohol vapor etches the layer 210 of sacrificial SiO2 through the patterned opening 221 in the layer of polysilicon 220. The etching continues until a desired amount of the layer 210 of the sacrificial SiO2 is etched. The layer 210 of sacrificial SiO2 is etched for a time sufficient until the layer 210 of sacrificial SiO2 is sufficiently undercut below the layer 220 of polysilicon, thereby forming a desired undercut MEMS device. Steps e) and f) leave a layer 240 of silicon nitride exposed during the release etch. As described below in greater detail with respect to FIG. 3A-3C, it has been discovered that this condition proved to be damaging to the exposed silicon nitride material. More specifically, in the case where small but deep features are formed, such as in the release etch, it is believed that an unusually dense diffusion of etch byproducts are emitted from the small opening 221, which are often in the area of a surface material such as low stress CVD silicon nitride, aluminum, titanium oxide, and titanium nitride.

When the MEMS device fabrication method of FIGS. 1 and 2 is performed according to the present invention, the release etching process of step f) in each process will be performed with a gaseous mixture of HF gas and an alcohol vapor selected from a group consisting of ethanol, 1-propanol, and an aliphatic alcohol having four carbon groups, wherein the gas phase mixture has a volumetric ratio of HF to the alcohol vapor of approximately 2 or less. Other suitable halide containing species may be used, including, without limitation, HF, NF3, CWF3, CHF3, and F2. Fabricating MEMS devices utilizing an etching step that uses a gaseous mixture of a halide containing species and one of the aforementioned alcohol vapors, in the specified volumetric ratio of 2 or less, results in etch uniformity, etch rate control, and etch selectivity that is not achievable using prior art etching methods and chemistries. By properly controlling temperature and pressure processing conditions, etch rate is not compromised and significant stiction problems do not arise. Specific operating conditions of the inventive etching process will be discussed in greater detail with respect to FIG. 4.

Figure 3A:
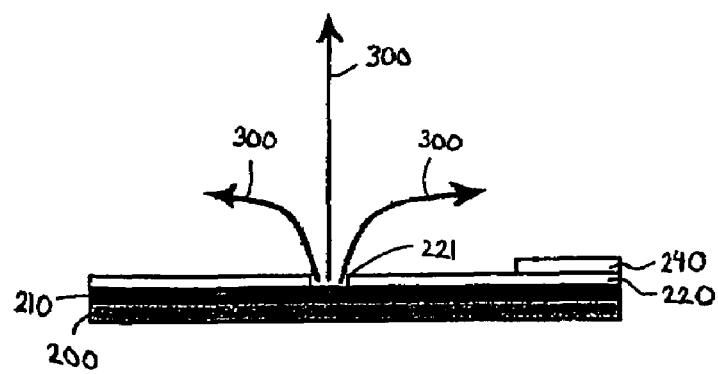
FIG. 3A is a schematic illustrating the conditions at the beginning of an etching process used to release a MEMS device according to a discovery of the present invention.
Figure 3B:
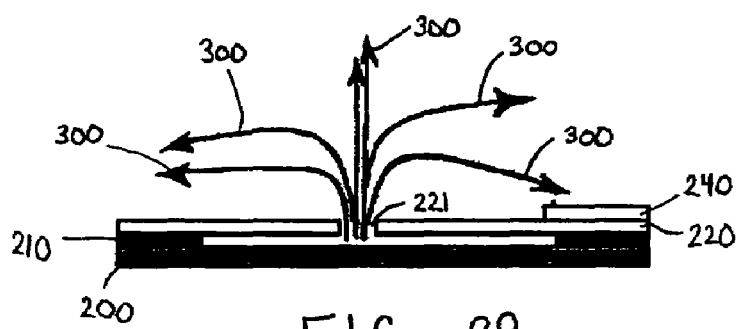
FIG. 3B is a schematic illustrating the hypothesized conditions at a later stage of the MEMS device release etching process of FIG. 3A that alters the normal selectivity of the etching process according to a discovery of the present invention.
Figure 3C:
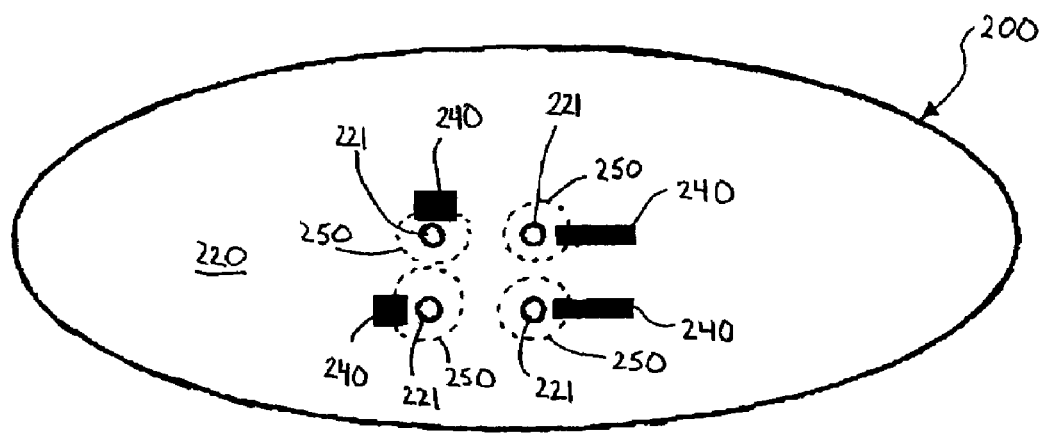
FIG. 3C is a schematic of a substrate used to form MEMS devices showing the areas of influence that are altered by the discovery illustrated in FIG. 3B.

Referring to FIGS. 3A-3C, the condition of the etching process in MEMS device fabrication that has been discovered to negatively effect etch selectivity, etch uniformity, etch rate control, and/or the overall quality of the resulting MEMS devices will be discussed. This condition explains how release etches that use prior art chemistries and concentrations, such as HF/methanol, negatively alter the normal selective etching of SiO2. The discovered condition is a new criteria for evaluation, and the selection of etching chemistries, concentrations, and/or process conditions for the etch release of MEMS devices and other microstructures from a silicon substrate. The condition will be illustrated with respect to the release etch of the MEMS fabrication process of FIG. 2 with the understanding that this condition exists in all MEMS release etching steps that use prior art chemistries, concentrations, and/or process conditions.

Referring first to FIG. 3A, when the release etch is initiated, a small amount of etch byproducts (e.g. H2O), indicated by arrows 300, are liberated from the opening 221 in the layer 220 of polysilicon at the etch site. Under this condition, normal etching selectivities and rates can be maintained.

However, once the undercut begins to take place, illustrated in FIG. 3B, subsequent etch rates often accelerate by up to ten times (in the undercut compared to on the surface of the substrate). The accelerated amount of byproducts 300 (i.e., water vapor) leaving the opening 221 affects the etch condition in the area 250 around each etch opening 221 (FIG. 3C). In this case, the layer 240 of silicon nitride in the local area could be damaged by pitting, or etched more severely than practical. Other materials that can be negatively affected by this change in etch condition include, without limitation, polysilicon, aluminum, titanium oxide, titanium nitride, and other materials that may be exposed. Additionally, while silicon nitride etches very slowly, such as fifty times slower than TEOS under normal process conditions, the silicon nitride is attacked heavily at or near the etch sites where release etching takes place.

Etch uniformity across the entire substrate 200 is also affected by diffusion of etch species beneath and in the fluid boundary layer. When using prior art chemistries, such as a gaseous HF/methanol mixture, no successful process conditions could be found where the layer 240 of silicon nitride was protected while satisfactorily etching the layer 210 of SiO2 in the undercut. As a result, in the case of MEMS release etching, an additional diffusion rate and pattern is now identified—that of the etch opening and the immediately surrounding surface area. It is desirable to protect the material in the local area around etch openings from excessive corrosion or excessive etching. Therefore, a new criteria for evaluation, and the selection of etching chemistries, concentrations, and/or process conditions for the etch release of MEMS devices and other microstructures from a silicon substrate was discovered. In short, a release etch was needed that did not excessively etch exposed silicon nitride or other materials at or near the etch site while adequately etching the sacrificial layer of SiO2. Stiction must also be avoided.

It has been discovered that performing the MEMS device release etch with a gaseous mixture of a halide containing species gas and an alcohol vapor selected from a group consisting of ethanol, 1-propanol, and an aliphatic alcohol having four carbon groups, wherein the gaseous mixture has a volumetric ratio of the halide containing species to the alcohol vapor of approximately 2 or less, remedies the aforementioned deficiencies discovered to occur at or near the etch sites. Suitable aliphatic alcohols having four carbon groups may include, without limitation, 1-butanol, 2-butanol, and t-butyl alcohol. Furthermore, in some embodiments, use of this new chemistry to release etch a MEMS device also satisfies the conditions for a clean, "stiction" free release etch, with high silicon oxide to silicon nitride (and other materials such as Aluminum, Titanium Nitride and list others) etching selectivity. An additional benefit of using the new chemistry is that overall silicon oxide etch uniformity across the entire substrate in a single wafer or batch reactor is improved.

Figure 4:
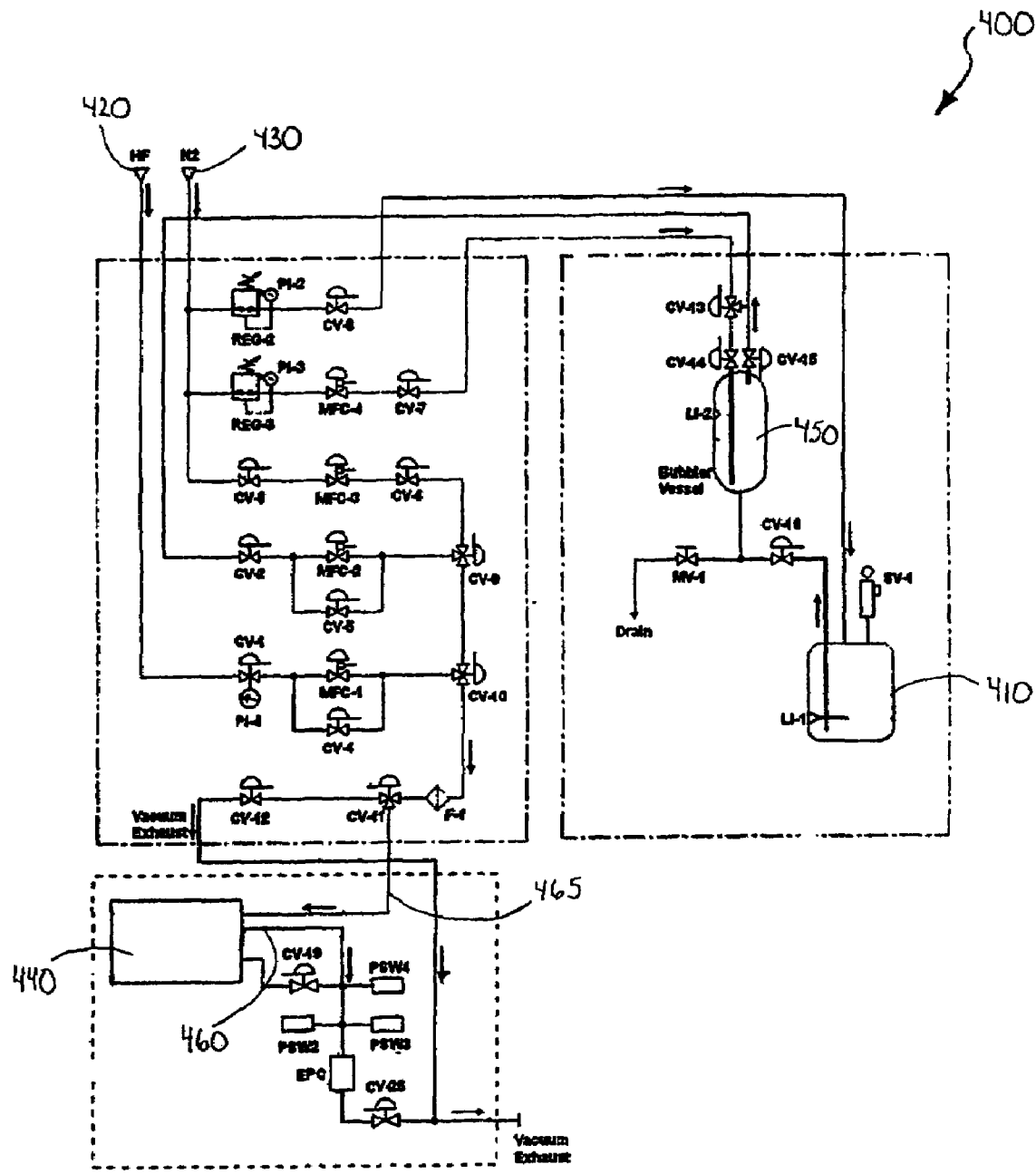
FIG. 4 is a schematic of a system for etching MEMS devices from a substrate according to an embodiment of the present invention.

Referring to FIG. 4, a system 400 for releasing a MEMS device from a substrate according to an embodiment of the present invention is schematically illustrated. The system 400, and its use in performing a release etch, are described below. The system 400 and its MEMS release etching process is exemplified using butanol and HF as the alcohol vapor and the halide containing species respectively with the understanding that any of the aforementioned alcohols and/or halide containing species can be substituted as desired. Additional suitable alcohols include ethanol, 1-propanol, and other aliphatic alcohols having four carbon groups. Suitable aliphatic alcohols having four carbon groups may include, without limitation, 1-butanol, 2-butanol, and t-butyl alcohol. Additional suitable halide containing species include without limitation, HF, NF3, ClF3, and F2.

The system 400 comprises a source of butanol 410, a source of HF 420, a source of nitrogen 430, a process chamber 440, and all of the necessary valving and plumbing components. All components of the system 400 are electrically coupled to and controlled by a process controller (not illustrated). More specifically, the processor controller is operably connected to all of the valves, pumps, sensors, heaters, and other automated components of the system 400 for communication therewith. These operable connections can be facilitated via the appropriate electric, fiber-optic, cable, or other suitable connections. The process controller is a suitable microprocessor based programmable logic controller, personal computer, or the like for process control, and preferably includes various input/output ports used to provide connections to the various components of the etching system 400 that need to be controlled and/or communicated with.

The process controller also preferably comprises sufficient memory to store process recipes, parameters, and other data, such as a desired concentration ratio, flow rates, processing times, processing temperatures, processing pressures, and all other processing conditions, and the like. The process controller can communicate with any and all of the various components of the etching system 400 to which it is operably connected in order to automatically adjust process conditions, such as activating flow through any one of feed lines either alone or in combination, pump activation, heat generation, pressure conditions in the process chamber 440, and pump down procedures. The type of process controller used depends on the exact needs of the system in which it is incorporated.

Initially, a plurality of patterned substrates, such as the ones shown in steps e) of FIGS. 1 and 2 are supported in the process chamber 440. The process chamber 440 can be a batch reactor, such as the one shown in co-pending U.S. patent application Ser. No. 10/991,554, filed Nov. 18, 2004. Alternatively, a single substrate chamber can be used. The substrates are at room temperature when introduced into the process chamber 440 and are subsequently heated to a temperature, preferably within a range of 25 to 150° C., more preferably within a range of 40-75° C., and most preferably to approximately 40-60° C. In an alternative embodiment of the invention, the substrates may be heated to the desirable temperature prior to being introduced into the process chamber, if desired.

Once the substrates are properly supported in the process chamber 440 and are at the desired temperature, the pressure in the process chamber 440 is reduced to a sub-atmospheric pressure by activating a pump on the process chamber exhaust line 465. Preferably, the pressure within the process chamber 440 is reduced to and maintained at a pressure preferably within a range of 50 to 350 Torr, more preferably within a range of 50 to 250 Torr, and most preferably within a range of 100 to 200 Torr. The pressure and temperature are selected that afford an operating condition where all the etch byproducts are volatile while a butanol ad-layer is formed that is sufficiently stable and abundant to support the dilution of the etch byproducts (e.g., water) on the surface of both the polysilicon and the silicon nitride on the substrates. The exact operating pressure used will be determined on a case by case basis, considering such factors as the local atmospheric pressure, the type of substrates being processed, the desired etch results, the operating temperature, etc.

Once the conditions (i.e., pressure and temperature) within the process chamber 440 are set, a gaseous mixture of HF gas and butanol vapor is introduced into the process chamber 440 via gas inlet line 465. The gas inlet line 465 is fluidly and operably connected to the source of HF gas 420, the source of N2 gas 340, and the bubbler 450. The bubbler 450 is operably coupled to the source of butanol alcohol 410. Using known techniques, liquid butanol is supplied to the bubbler 450 where it is converted into a vapor state. If desired, a carrier gas, such as the N2 gas can be used to transport the butanol vapor from the bubbler 450. Once created, the butanol vapor is drawn from the bubbler 450 and combined with the HF gas stream to form a gaseous mixture. This gaseous mixture is then introduced into the process chamber 440 via gas inlet line 465 where it contacts the substrates, thereby selectively etching the sacrificial SiO2.

The flow rates (volumetric or mass) of the HF gas stream and the butanol gas stream are controlled (via valves and/or pumps) so that the gaseous mixture is created having a desired ratio of HF gas to butanol vapor. Preferably, the flow rates of HF gas stream and the butanol gas stream are controlled so that the gaseous mixture has a volumetric ratio of HF gas to butanol vapor of approximately 2 or less. Most preferably, the ratio is approximately 0.5 to 1.0.

The gaseous mixture of HF gas and butanol vapor flows through the process chamber (thereby etching the substrates) at a desired flow rate. Preferably, this flow rate is in the range of 1.5 to 2.5 liters/minute. This is performed for a predetermined period of time.

In some embodiments, the pressure in the process chamber 240 will be pumped down at set intervals to a base pressure, such as for example 5 Torr. The flow of the gaseous mixture through the process chamber is discontinued during the pump down period (and initiated once again after the pump down period has terminated). The pump down procedure is initiated when a portion of a desired amount of sacrificial SiO2 has been removed from the substrates and is performed to remove residual gases and liquids from the substrates and/or chamber. After a certain amount of time elapses, the flow of the gaseous mixture through the process chamber is resumed and the pressure within the process chamber is returned to the operating pressure. This sequence is repeated until the desired amount of sacrificial SiO2 is etched from the substrates.

The method discussed above preferably result in an etching selectivity of sacrificial oxide SiO2 to non-sacrificial materials, such as polysilicon, silicon nitride, titanium oxide, titanium nitride, etc., of 1000 or greater. For SiN, the etching selectivity is preferably 60 or greater.

In the aforementioned example, butanol was used to satisfy the conditions of selective etch while maintaining the release etch anti-stiction characteristics. Butanol has a lower vapor pressure than methanol, ethanol, 1-propanol, or isopropanol and water (and the etchant HF). This allows an operating condition where all the etch byproducts are volatile while a butanol ad-layer is formed that is sufficiently stable and abundant to support the dilution of the etch byproducts (e.g., water) on the surface of both the polysilicon and the silicon nitride.

In the prior art, it was noted that greater selectivities occurred only when there was abundant vapor pressures available for methanol or isopropyl alcohols. However, using butanol or any of the other alcohols of the present invention at the determined concentration ratio, the results were achieved by using lower vapor pressure material, allowing a greater separation of the etch byproducts. By lowering the amount of H2O on the surface, particulate residues were reduced along with the reduction in etch of the resistant materials (i.e., silicon nitrides etc.). Even under the local conditions shown in FIG. 3C, good oxide selectivity was measured (CVD TEOS/ low stress CVD Nitride).

Figure 5:
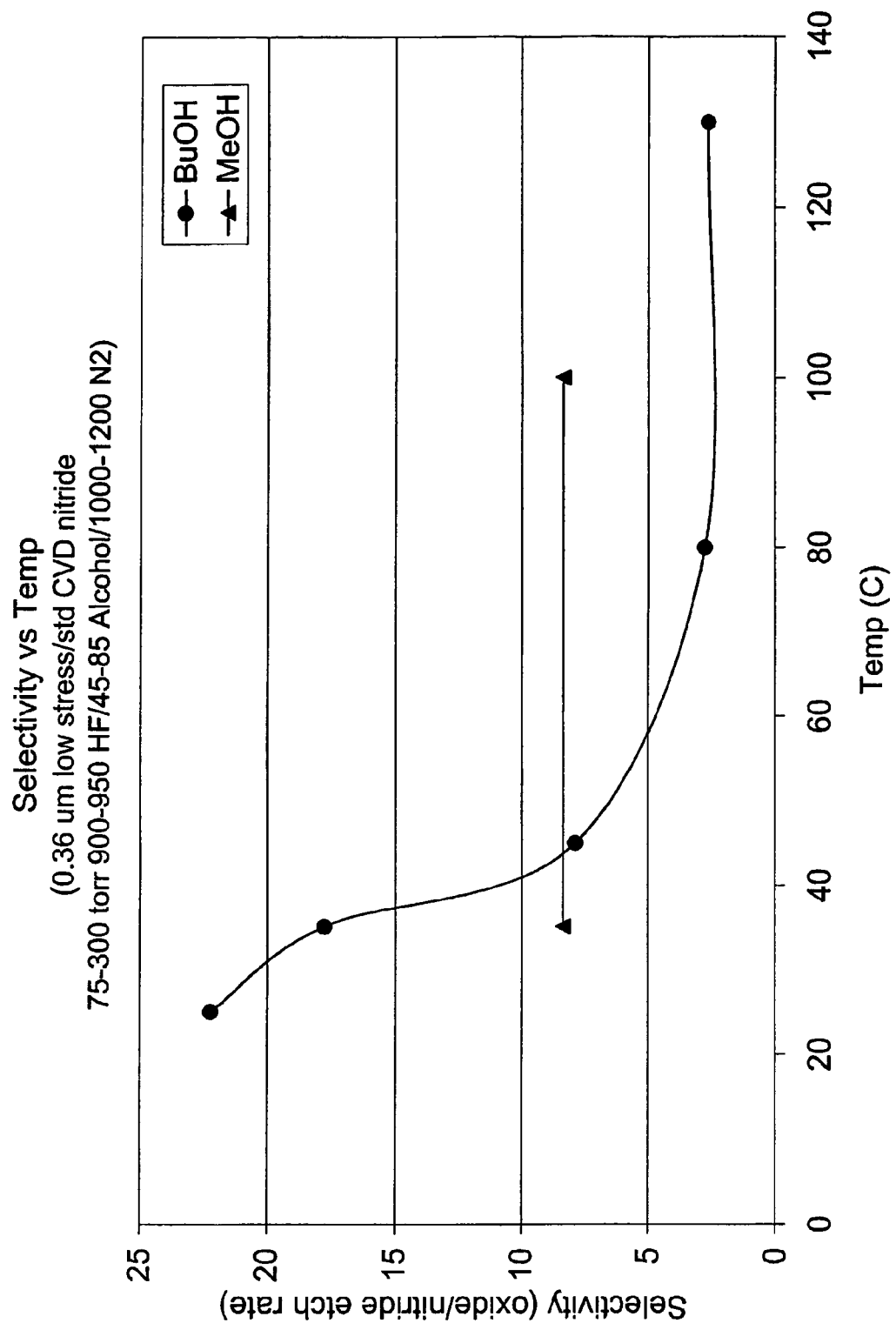
FIG. 5 is a graph of selectivity vs. temperature for a gaseous HF/butanol according to an embodiment of the present invention compared to an HF/methanol release etch.

FIG. 5 is a graph of selectivity vs. temp for butanol vapor catalyzed HF etching according to an embodiment of the present invention compared to an HF/methanol release etch. The data illustrates that butanol vapor catalyzed HF etching can produce surface conditions where silicon nitride is etched below 5% of a CVD oxide in a deep channel. Different reactants adhere to different substrate materials differently. In the case of silicon nitrides, it is found that butanol is able to adhere to the surface sufficiently to protect the normally selective condition. This selective condition which was altered during the local release etch, was maintained by the use of butanol due to its different vapor pressure with respect to water, and its sticking characteristic.

Surface adhesion layers were created by the use of the higher pressures and/or lower temperatures. In this new case, the use of Butanol provided the characteristics that are necessary to protect local silicon nitride films while preserving the relatively fast etching of oxides in MEMS sacrificial layers.

In another observation, while using HF/butanol in the expressed conditions of FIG. 5 with a batch reactor, overall wafer uniformity using a 49 point automated measurement with blanket films of thermal and CVD oxides were improved. In particular, the across wafer uniformity, which was affected by a "loading" affect (or the local area influence of release etching), was found to be uniform to about 2.2% 1 sigma value. Before the use of butanol as described above, these values were usually greater than about 5%. Therefore, uniformity improved both locally near MEMS channel etch as well as on large planar surfaces. Thus, the sacrificial SiO2 is preferably etched across the entire substrates at a uniformity of 5% or less and at an etch rate of 90 Angstroms/minute or greater.

Figure 6:
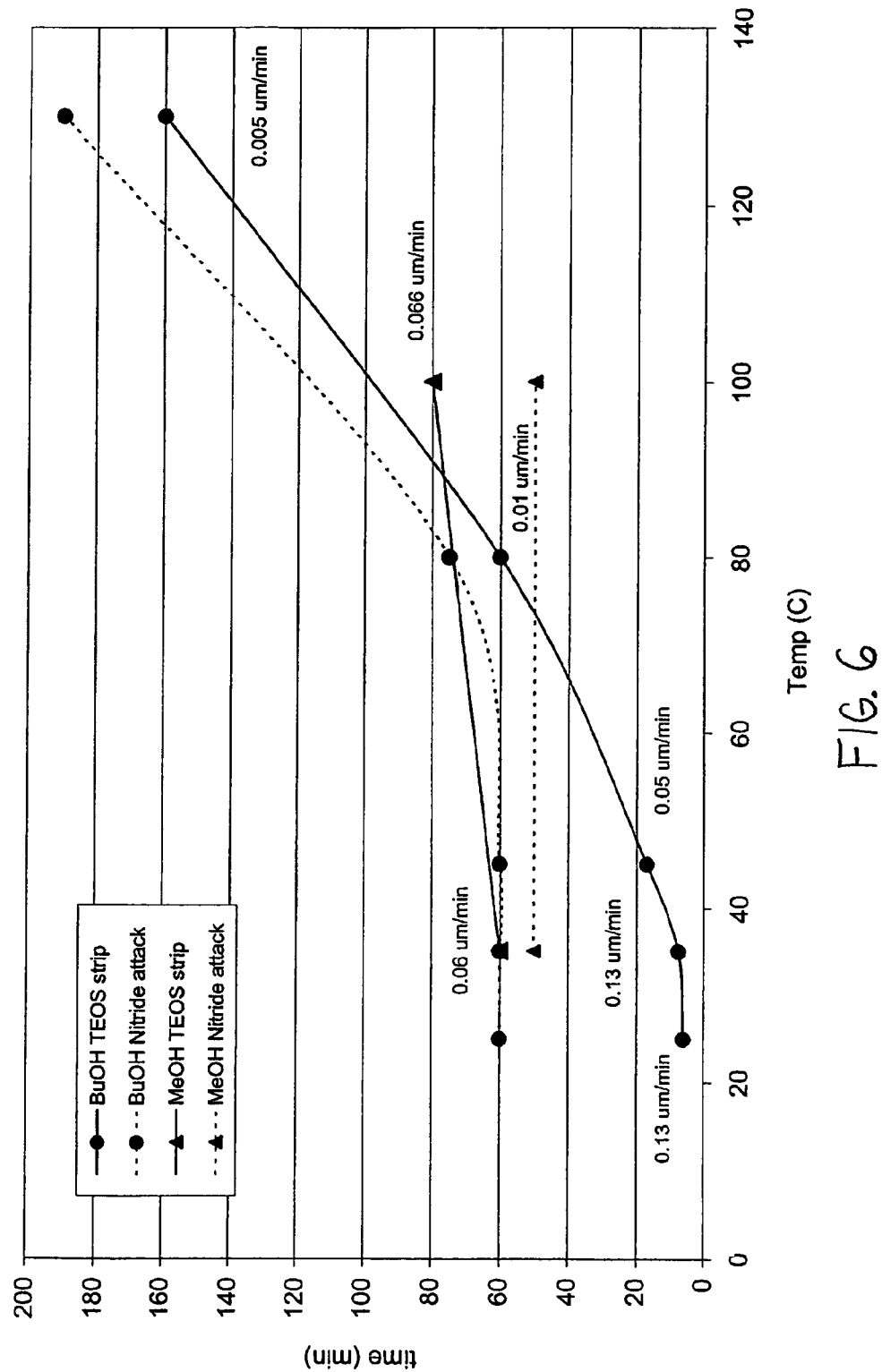
FIG. 6 is a graph of time to strip TEOS and attack nitride vs. temperature comparing a gaseous HF/butanol release etch according to an embodiment of the present invention and a prior art HF/methanol release etch.

FIG. 6 is a graph of time to strip TEOS and attack nitride vs. temperature for both butanol/HF and prior art methanol/HF gaseous etches.

In the aforementioned example, butanol was used to satisfy the conditions of selective etch while maintaining the release etch anti-stiction characteristics. However, any of the other alcohol vapors discussed above can be used.

While the invention has been described and illustrated in detail, various alternatives and modifications will become readily apparent to those skilled in the art without departing from the spirit and scope of the invention.

What is claimed is:

1. A method of releasing a micro-electrical-mechanical-systems (MEMS) device from a substrate comprising:
   (a) supporting at least one substrate having a sacrificial oxide and a non-sacrificial material in a process chamber at a pressure and at a temperature;
   (b) introducing a gas phase mixture comprising a halide-containing species and an alcohol vapor selected from a group consisting of ethanol, 1-propanol, and an aliphatic alcohol having four carbon groups into the process chamber, the gas phase mixture having a volumetric ratio of the halide-containing species to the alcohol vapor of approximately 2 or less; and
   (c) etching the sacrificial oxide with the gas phase mixture wherein the volumetric ratio of the halide-containing species to the alcohol vapor in the gas phase mixture is approximately 2 or less.

2. The method of claim 1 wherein the process chamber is enclosed, and the pressure of the process chamber is at subatmospheric pressure.

3. The method of claim 2 wherein the pressure of the process chamber is within a range of approximately 50 to 350 Torr.

4. The method of claim 1 wherein the temperature between 25 to 150 degrees Celsius.

5. The method of claim 1 wherein the the halide-containing species is hydrofluoric acid and the alcohol vapor is ethanol vapor.

6. The method of claim 1 wherein the gas phase mixture is introduced and removed from the process chamber at a flow rate of 1.5 to 2.5 liters/minute.

7. A method of releasing a micro-electrical-mechanical-systems (MEMS) device from a substrate comprising:
   (a) supporting at least one substrate having a sacrificial oxide and a non-sacrificial material in a process chamber at a pressure and at a temperature;
   (b) introducing a gas phase mixture comprising a halide-containing species and an alcohol vapor selected from a group consisting of ethanol, 1-propanol, and an aliphatic alcohol having four carbon groups into the process chamber, the gas phase mixture having a volumetric ratio of the halide-containing species to the alcohol vapor of approximately 2 or less; and
   (c) etching the sacrificial oxide with the gas phase mixture further comprising:
   (d) forming an ad-layer of the alcohol vapor on the non-sacrificial material at or near an etching site on the substrate to protect the non-sacrificial material at or near the etching site from etch byproducts created during performance of step (c).

8. The method of claim 7 wherein the pressure of the process chamber is maintained so that the etch by-products formed during the performance of step (c) are substantially maintained in the gas phase while the alcohol vapor is sufficiently stable to form the ad-layer at the temperature.

9. A method of releasing a micro-electrical-mechanical-systems (MEMS) device from a substrate comprising:
   (a) supporting at least one substrate having a sacrificial oxide and a non-sacrificial material in a process chamber at a pressure and at a temperature;
   (b) introducing a gas phase mixture comprising a halide-containing species and an alcohol vapor selected from a group consisting of ethanol, 1-propanol, and an aliphatic alcohol having four carbon groups into the process chamber, the gas phase mixture having a volumetric ratio of the halide-containing species to the alcohol vapor of approximately 2 or less; and
   (c) etching the sacrificial oxide with the gas phase mixture wherein the performance of step (c) results in an etching selectivity of sacrificial oxide to non-sacrificial material of 1000 or greater.

10. The method of claim 9 wherein the sacrificial oxide is silicon oxide and the non-sacrificial material is polysilicon.

11. A method of releasing a micro-electrical-mechanical-systems (MEMS) device from a substrate comprising:
   (a) supporting at least one substrate having a sacrificial oxide and a non-sacrificial material in a process chamber at a pressure and at a temperature;

(b) introducing a gas phase mixture comprising a halide-containing species and an alcohol vapor selected from a group consisting of ethanol, 1-propanol, and an aliphatic alcohol having four carbon groups into the process chamber, the gas phase mixture having a volumetric ratio of the halide-containing species to the alcohol vapor of approximately 2 or less; and (c) etching the sacrificial oxide with the gas phase mixture wherein the non-sacrificial material is SiN and the performance of step (c) results in an etching selectivity of sacrificial oxide to SiN non-sacrificial material of 60 or greater.

12. A method of releasing a micro-electrical-mechanical-systems (MEMS) device from a substrate comprising:
(a) supporting at least one substrate having a sacrificial oxide and a non-sacrificial material in a process chamber at a pressure and at a temperature;
(b) introducing a gas phase mixture comprising a halide-containing species and an alcohol vapor selected from a group consisting of ethanol, 1-propanol, and an aliphatic alcohol having four carbon groups into the process chamber, the gas phase mixture having a volumetric ratio of the halide-containing species to the alcohol vapor of approximately 2 or less; and
(c) etching the sacrificial oxide with the gas phase mixture wherein a plurality of substrates are supported in the process chamber.

13. A method of releasing a micro-electrical-mechanical-systems (MEMS) device from a substrate comprising:
(a) supporting at least one substrate having a sacrificial oxide and a non-sacrificial material in a process chamber at a pressure and at a temperature;
(b) introducing a gas phase mixture comprising a halide-containing species and an alcohol vapor selected from a group consisting of ethanol, 1-propanol, and an aliphatic alcohol having four carbon groups into the process chamber, the gas phase mixture having a volumetric ratio of the halide-containing species to the alcohol vapor of approximately 2 or less; and
(c) etching the sacrificial oxide with the gas phase mixture further comprising:
(d) pumping down the process chamber after a portion of a desired amount of sacrificial oxide is etched; and
(e) repeating steps (b) through (d) until the desired amount of sacrificial oxide is etched from the substrate.

14. A method of releasing a micro-electrical-mechanical-systems (MEMS) device from a substrate comprising:
(a) supporting at least one substrate having a sacrificial oxide and a non-sacrificial material in a process chamber at a pressure and at a temperature;
(b) introducing a gas phase mixture comprising a halide-containing species and an alcohol vapor selected from a group consisting of ethanol, 1-propanol, and an aliphatic alcohol having four carbon groups into the process chamber, the gas phase mixture having a volumetric ratio of the halide-containing species to the alcohol vapor of approximately 2 or less; and
(c) etching the sacrificial oxide with the gas phase mixture wherein step (c) comprises etching the sacrificial oxide across the substrate at a uniformity of 5% or less.

15. A method of releasing a micro-electrical-mechanical-systems (MEMS) device from a substrate comprising:
(a) supporting at least one substrate having a sacrificial oxide and a non-sacrificial material in a process chamber at a pressure and at a temperature;
(b) introducing a gas phase mixture comprising a halide-containing species and an alcohol vapor selected from a group consisting of ethanol, 1-propanol, and an aliphatic alcohol having four carbon groups into the process chamber, the gas phase mixture having a volumetric ratio of the halide-containing species to the alcohol vapor of approximately 2 or less; and
(c) etching the sacrificial oxide with the gas phase mixture wherein step (c) comprises etching the sacrificial oxide at rate of 90 Angstroms/minute or greater for blanket oxide substrates or 0.06 microns/minute or greater for device substrates.

16. The method of claim 15 wherein the non-sacrificial material is selected from the group consisting of polysilicon, silicon nitride, aluminum, silicon carbide, singe crystal silicon, and titanium nitride.

17. A method of releasing a micro-electrical-mechanical-systems (MEMS) device from a substrate comprising:
(a) supporting at least one substrate having a sacrificial oxide and a non-sacrificial material in a process chamber at a pressure and at a temperature;
(b) introducing a gas phase mixture comprising a halide-containing species and an alcohol vapor selected from a group consisting of ethanol, 1-propanol, and an aliphatic alcohol having four carbon groups into the process chamber, the gas phase mixture having a volumetric ratio of the halide-containing species to the alcohol vapor of approximately 2 or less; and (c) etching the sacrificial oxide with the gas phase mixture:
wherein the non-sacrificial material of the substrate is a structural material, and the substrate supported in step (a) comprises a layer of the sacrificial oxide under a layer of the structural material, the structural layer having at least one opening exposing a portion of the sacrificial layer; and
wherein the performance of step (c) comprises exposing the sacrificial layer to the gas phase mixture through the at least one opening to form an undercut feature.

18. A method of releasing a micro-electrical-mechanical-systems (MEMS) device from a substrate comprising:
(a) supporting at least one substrate having a sacrificial oxide and a non-sacrificial material in a process chamber at a pressure and at a temperature;
(b) introducing a gas phase mixture comprising a halide-containing species and an alcohol vapor selected from a group consisting of ethanol, 1-propanol, and an aliphatic alcohol having four carbon groups into the process chamber, the gas phase mixture having a volumetric ratio of the halide-containing species to the alcohol vapor of approximately 2 or less; and
(c) etching the sacrificial oxide with the gas phase mixture wherein the non-sacrificial material of the substrate is a structural material, and the substrate supported in step (a) comprises a layer of the sacrificial oxide under a layer of the structural material, the structural layer having at least one opening exposing a portion of the sacrificial layer, wherein the performance of step (c) comprises exposing the sacrificial layer to the gas phase mixture through the at least one opening to form an undercut feature, the method further comprising:
(d) forming an ad-layer of the alcohol vapor on the layer of the non-sacrificial material at or near the opening to protect the non-sacrificial material at or near the opening from etch byproducts created during performance of step (c);
(e) pumping down the process chamber after a portion of a desired amount of sacrificial oxide is etched; and (f) repeating steps (b) through (e) until the desired amount of sacrificial oxide is etched from the substrate;

wherein the pressure of the process chamber is maintained within a range of approximately 50 to 350 Torr;

wherein the temperature is between 25 to 150 degrees Celsius;

wherein the gas phase mixture comprises hydrofluoric acid and ethanol vapor;

wherein an etching selectivity of sacrificial oxide to structural material of 60 or greater is achieved;

wherein the gas phase mixture is introduced and removed from the process chamber at a flow rate of 1.5 to 2.5 liters/minute;

wherein a plurality of substrates are supported in the process chamber;

wherein the volumetric ratio of the hydrofluoric acid to the alcohol vapor in the gas phase mixture is approximately 2 or less;

wherein step (c) comprises etching the sacrificial oxide across the substrate at a uniformity of 5% or less;

wherein step (c) comprises etching the sacrificial oxide at rate of 90 Angstroms/minute or greater for blanket oxide substrates or 0.06 microns/minute or greater for device substrates.

19. A system for releasing a micro-electrical-mechanical-systems (MEMS) device from a substrate comprising:

a process chamber having a support for supporting at least one substrate having a sacrificial oxide and a non-sacrificial material;

a source of an alcohol selected from a group consisting of ethanol, 1-propanol, and an aliphatic alcohol having four carbon groups fluidly coupled to the process chamber;

a source of a halide-containing species fluidly coupled to the process chamber; and means for simultaneously supplying the alcohol as a vapor and the halide-containing species as a gas to the process chamber such that a volumetric ratio of the halide-containing species gas to the alcohol vapor is approximately 2 or less.

20. The method of claim 3 wherein the pressure of the process chamber is within a range of 50 to 250 Torr.

21. A method of releasing a micro-electrical-mechanical-systems (MEMS) device from a substrate comprising:

(a) supporting at least one substrate having a sacrificial oxide and a non-sacrificial material in a process chamber at a pressure and at a temperature;

(b) introducing a gas phase mixture comprising a halide-containing species and an alcohol vapor selected from a group consisting of ethanol, 1-propanol, and an aliphatic alcohol having four carbon groups into the process chamber, the gas phase mixture having a volumetric ratio of the halide-containing species to the alcohol vapor of approximately 2 or less; and (c) etching the sacrificial oxide with the gas phase mixture wherein the pressure of the process chamber is within a range of 100 to 200 Torr.

* * * * *